(12) United States Patent
Chi et al.

(10) Patent No.: US 7,599,456 B1
(45) Date of Patent: Oct. 6, 2009

(54) INPUT/OUTPUT DATA RATE SYNCHRONIZATION USING FIRST IN FIRST OUT DATA BUFFERS

(75) Inventors: Zhipei Chi, Sunnyvale, CA (US); Runsheng He, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 740 days.

(21) Appl. No.: 11/109,988

(22) Filed: Apr. 20, 2005

Related U.S. Application Data

(60) Provisional application No. 60/635,806, filed on Dec. 13, 2004.

(51) Int. Cl.
*H04L 7/00* (2006.01)
(52) U.S. Cl. .......................... 375/354; 370/232; 710/65
(58) Field of Classification Search ......... 375/354–372; 710/52, 56, 58–61, 65; 370/229, 230, 232
See application file for complete search history.

(56) References Cited

U.S. PATENT DOCUMENTS 5,708,686 A * 1/1998 Assmus et al. .............. 375/372
6,463,069 B1 * 10/2002 Eriksson et al. ............. 370/428
2002/0176425 A1 * 11/2002 Aoki ....................... 370/395.4
2003/0016697 A1 * 1/2003 Jordan ........................ 370/466
2003/0122692 A1 * 7/2003 Roeckner et al. ............ 341/53
2004/0184573 A1 * 9/2004 Andersen et al. ............ 375/372

* cited by examiner

*Primary Examiner*—Shuwang Liu
*Assistant Examiner*—James M Perez

(57) ABSTRACT

An input/output data rate synchronization system includes a first data buffer that receives input data at a first rate, that temporarily stores the input data, and that outputs the input data at a second rate. A data processing module receives the input data from the first data buffer and outputs processed data at a third rate. A second data buffer receives the processed data from the data processing module at the third rate, temporarily stores the processed data, and outputs the processed data at a fourth rate. The data processing module temporarily stops receiving the input data and generating the processed data when the second data buffer exceeds a first predetermined capacity. The data processing module increases the second rate when the first data buffer exceeds a second predetermined capacity and decreases the second rate when a difference between the second and first rates is greater than a predetermined rate.

42 Claims, 10 Drawing Sheets

INPUT/OUTPUT DATA RATE SYNCHRONIZATION USING FIRST IN FIRST OUT DATA BUFFERS

CROSS-REFERENCE TO RELATED APPLICATIONS

This application claims the benefit of U.S. Provisional Application No. 60/635,806, filed on Dec. 13, 2004, which is hereby incorporated by reference in its entirety.

FIELD OF THE INVENTION

The present invention relates to power amplifiers, and more particularly to digital Class-D power amplifiers that perform signal processing.

BACKGROUND OF THE INVENTION

Amplifiers are typically used to amplify low-level audio signals in order to drive audio speakers such as headphones, loudspeakers, and/or other audio devices. Class-D amplifiers have a relatively high efficiency and are particularly applicable to portable audio devices. However, Class-D amplifiers are also used in non-portable audio applications. Class-D amplifiers include power transistors that are operated in either a fully-on or a fully-off state. A Class-D amplifier generates an amplified binary signal that conveys the same information as a digital input signal.

Referring to FIGS. 1 and 2, an exemplary Class-D amplifier 10 includes a digital signal processor (DSP) 12 that receives a digital audio input signal. Alternatively, the Class-D amplifier 10 may include an application-specific integrated circuit (ASIC) or another integrated circuit instead of or in addition to the DSP 12. The DSP 12 amplifies the input signal and generates a pulse width modulated (PWM) signal based on the input signal. In an exemplary embodiment, the amplifier 10 is a tri-state amplifier 10, and the PWM signal consists of three values. For example, the values may be −1, 0, and +1.

A sourcing transistor 14, a sinking transistor 16, and a ground transistor 18 all receive the PWM signal. The sourcing transistor 14 communicates with a positive supply potential $V_{dd}$, the sinking transistor 16, and the ground transistor 18. The sinking transistor 16 communicates with a negative supply potential $-V_{dd}$, the sourcing transistor 14, and the ground transistor 18. The ground transistor 18 communicates with a ground potential, the sourcing transistor 14, and the sinking transistor 16.

The PWM waveform functions as a digital control signal that switches the sourcing and sinking transistors 14 and 16, respectively, on and off based on the amplitude of the input signal. The gain of the amplifier 10 is adjusted by varying the value of the positive and negative supply potentials. The sourcing and sinking transistors 14 and 16, respectively, generate a high-power version of the PWM waveform, which includes components of the input signal as well as components resulting from the PWM conversion process. Therefore, a low-pass filter 20 receives the amplified PWM waveform and outputs lower frequency signals while restricting higher frequency signals. The low-pass filter 20 also has the effect of smoothing transitions in the amplified PWM waveform.

The filtered waveform is received by a load 22 that communicates with a ground potential. For example, the load 22 may be an audio speaker. The ground transistor 18 is turned on in order to ground the common node between the sourcing and sinking transistors 14 and 16, respectively, the ground transistor 18, and the low-pass filter 20. In the event that the low-pass filter 20 includes one or more inductors, the ground transistor 18 provides a ground path to discharge the inductors. This prevents adverse effects to the amplifier circuit 10 that may be caused by the inductors remaining in a charged state.

The DSP 12 includes a sawtooth generator 28 that generates a sawtooth reference signal 30. As shown in FIG. 2, the DSP utilizes the sawtooth reference signal 30 to sample a digital audio input signal 32. A frequency of the sawtooth waveform 30 determines a sampling rate for the input signal 32. The DSP 12 detects intersection points of the input signal 32 and the ramp portions of the sawtooth waveform 30. The intersection points are converted into a PWM waveform 34. The PWM waveform 34 includes positive pulses 36 and negative pulses 38. The amplitudes of the pulses 36 and 38 are equal to the supply potential of the amplifier 10.

Intersection points that are located below zero are converted into negative pulses 38 in the PWM waveform 34. Intersection points that are located above zero are converted into positive pulses 34. Positive pulses 36 begin at reference times of the sawtooth waveform 30. For example, the reference times may occur at points where the ramp portions of the sawtooth waveform 30 are equal to zero. Positive pulses 36 end at respective intersection points of the input signal 32 and the sawtooth waveform 30. Negative pulses 38 begin at intersection points that are located below zero and end at respective reference times of the sawtooth waveform 30. This results in the PWM waveform 34, which exhibits one of three states.

There is a delay time at the DSP 12 associated with processing the input signal 32 and generating the PWM waveform 36. Therefore, the DSP 12 is typically required to temporarily store incoming and/or outgoing data in order to avoid unintentionally discarding data. In one approach, a data buffer is used to temporarily store incoming and/or outgoing data to/from the DSP 12. However, it is necessary but difficult to synchronize a first rate at which a data buffer receives data and a second rate at which the data buffer outputs data in order to avoid buffer underflow and/or overflow conditions. Additionally, this difficulty is compounded when data buffers are included at both the input and the output of the DSP 12. In this case, data rate synchronization is required with respect to each of the data buffers individually and with respect to both of the data buffers collectively. This is necessary to ensure that data is received and output by the DSP 12 consistently and at the same rate.

SUMMARY OF THE INVENTION

An input/output data rate synchronization system according to the present invention includes a first data buffer that receives input data at a first rate, that temporarily stores the input data, and that outputs the input data at a second rate. A data processing module receives the input data from the first data buffer at the second rate and outputs processed data at a third rate. A second data buffer receives the processed data from the data processing module at the third rate, temporarily stores the processed data, and outputs the processed data at a fourth rate. The data processing module temporarily stops receiving the input data and generating the processed data when the second data buffer exceeds a first predetermined capacity. The data processing module increases the second rate when the first data buffer exceeds a second predetermined capacity.

In other features, while the data processing module stops receiving the input data and generating the processed data, the data processing module resumes receiving the input data and generating the processed data when the second data buffer no longer exceeds the first predetermined capacity. The second data buffer includes a read pointer and a write pointer. The data processing module determines an amount of the processed data in the second data buffer with respect to the first predetermined capacity by computing a difference between positions of the read and write pointers. The input data is a digital audio signal. The first rate is equal to a first sampling frequency of the digital audio signal. The data processing module includes an up-sampling module that increases the first sampling frequency to a second sampling frequency and a natural sampling module that samples the digital audio signal based on a reference signal. The data processing module adjusts a ratio of the second sampling frequency to a frequency of the reference signal in order to adjust the second rate.

In still other features of the invention, at least one of the first rate and/or the fourth rate is fixed. The first data buffer includes a read pointer and a write pointer. The data processing module determines an amount of the input data in the first data buffer with respect to the second predetermined capacity by computing a difference between positions of the read and write pointers. The second rate is based on a rate of change of the difference between positions of the read and write pointers. The data processing module updates a value of the rate of change when a difference between a first difference between positions of the read and write pointers at a first time and a second difference between positions of the read and write pointers at a second time is greater than a predetermined value. The data processing module updates a value of the rate of change when a current difference between positions of the read and write pointers is greater than a predetermined value.

In yet other features, the data processing module updates a value of the rate of change when a difference between a first average of differences between positions of the read and write pointers over a first time period and a second average of differences between positions of the read and write pointers over a second time period is greater than a predetermined value. The data processing module updates a value of the rate of change when an average of differences between positions of the read and write pointers over a time period is greater than a predetermined value.

In still other features of the invention, the data processing module includes a natural sampling module that samples the input data based on a reference signal. The reference signal is a sawtooth waveform. The natural sampling module varies a frequency of the reference signal in order to perform spread spectrum natural sampling. The fourth rate is initially set equal to a frequency of the reference signal.

In yet other features, the data processing module decreases the second rate when a difference between the second and first rates is greater than a predetermined rate. The third rate is initially set greater than the fourth rate. The second rate is initially set equal to the first rate. The input data is a digital audio signal. The first and second data buffers are first in first out (FIFO) data buffers. A digital signal processor (DSP) comprises the input/output data rate synchronization system. A digital Class-D amplifier comprises the DSP.

An input/output data rate synchronization system includes first data buffering means for receiving input data at a first rate, for temporarily storing the input data, and for outputting the input data at a second rate. Data processing means processes data, receives the input data from the first data buffering means at the second rate, and outputs processed data at a third rate. Second data buffering means receives the processed data from the data processing means at the third rate, temporarily stores the processed data, and outputs the processed data at a fourth rate. The data processing means temporarily stops receiving the input data and generating the processed data when the second data buffering means exceeds a first predetermined capacity. The data processing means increases the second rate when the first data buffering means exceeds a second predetermined capacity.

In other features, while the data processing means stops receiving the input data and generating the processed data, the data processing means resumes receiving the input data and generating the processed data when the second data buffering means no longer exceeds the first predetermined capacity. The second data buffering means includes read pointing means for indicating a read address in the second data buffering means. Write pointing means indicates a write address in the second data buffering means. The data processing means determines an amount of the processed data in the second data buffering means with respect to the first predetermined capacity by computing a difference between positions of the read pointing means and the write pointing means. The input data is a digital audio signal. The first rate is equal to a first sampling frequency of the digital audio signal. The data processing means includes up-sampling means for increasing the first sampling frequency to a second sampling frequency. Natural sampling means samples the digital audio signal based on a reference signal. The data processing means adjusts a ratio of the second sampling frequency to a frequency of the reference signal in order to adjust the second rate.

In still other features of the invention, at least one of the first rate and/or the fourth rate is fixed. The first data buffering means includes read pointing means for indicating a read address in the first data buffering means. Write pointing means indicates a write address in the first data buffering means. The data processing means determines an amount of the input data in the first data buffering means with respect to the second predetermined capacity by computing a difference between positions of the read pointing means and the write pointing means. The second rate is based on a rate of change of the difference between positions of the read pointing means and the write pointing means. The data processing means updates a value of the rate of change when a difference between a first difference between positions of the read pointing means and the write pointing means at a first time and a second difference between positions of the read pointing means and the write pointing means at a second time is greater than a predetermined value. The data processing means updates a value of the rate of change when a current difference between positions of the read pointing means and the write pointing means is greater than a predetermined value.

In yet other features, the data processing means updates a value of the rate of change when a difference between a first average of differences between positions of the read pointing means and the write pointing means over a first time period and a second average of differences between positions of the read pointing means and the write pointing means over a second time period is greater than a predetermined value. The data processing means updates a value of the rate of change when an average of differences between positions of the read pointing means and the write pointing means over a time period is greater than a predetermined value.

In still other features of the invention, the data processing means includes natural sampling means for sampling the input data based on a reference signal. The reference signal is a sawtooth waveform. The natural sampling means varies a frequency of the reference signal in order to perform spread spectrum natural sampling. The fourth rate is initially set equal to a frequency of the reference signal.

In yet other features, the data processing means decreases the second rate when a difference between the second and first rates is greater than a predetermined rate. The third rate is initially set greater than the fourth rate. The second rate is initially set equal to the first rate. The input data is a digital audio signal. The first data buffering means and the second data buffering means are first in first out (FIFO) data buffers. A digital signal processor (DSP) comprises the input/output data rate synchronization system. A digital Class-D amplifier comprises the DSP.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1:
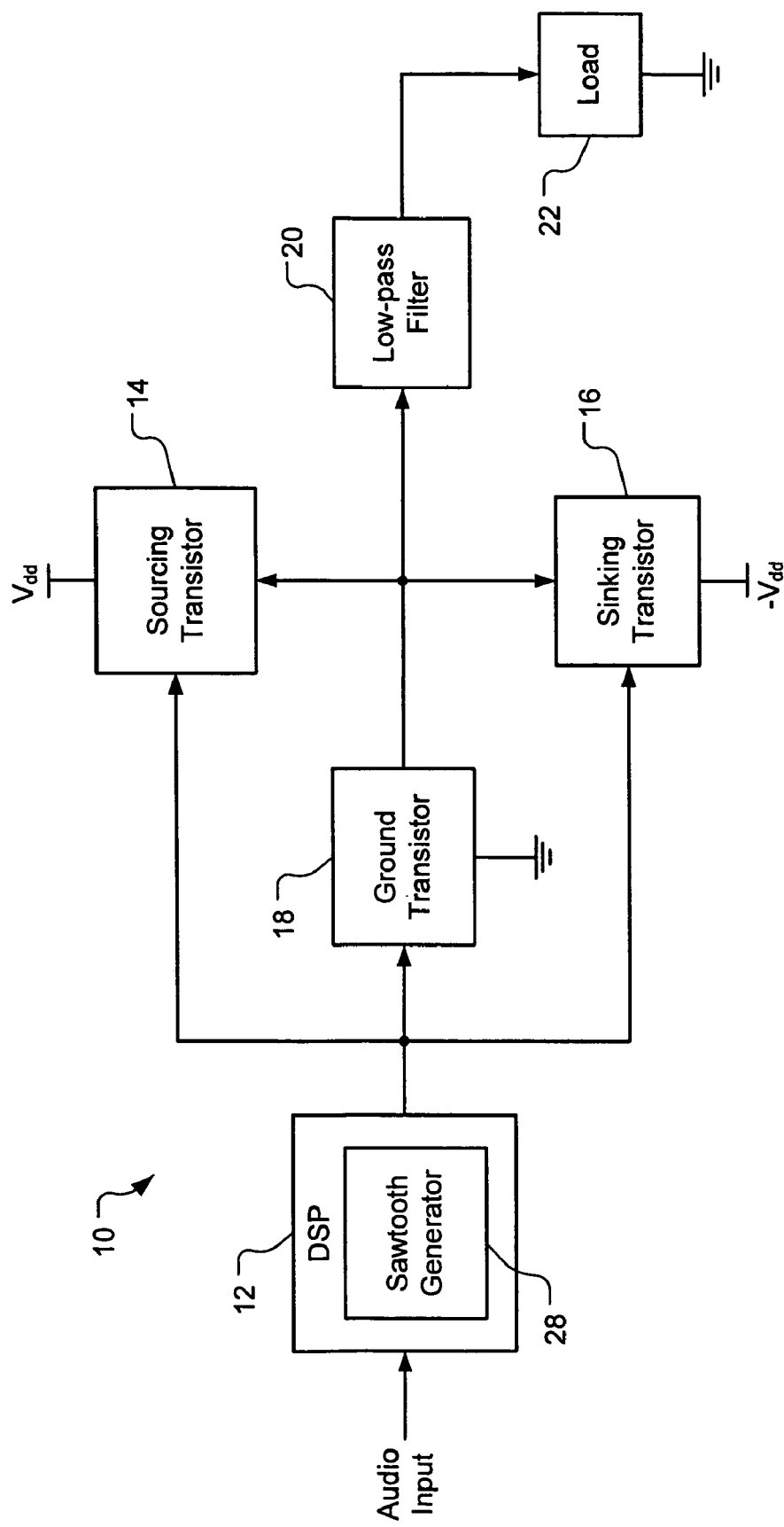
FIG. 1 is a functional block diagram of a tri-state Class-D digital power amplifier according to the prior art.
Figure 2:
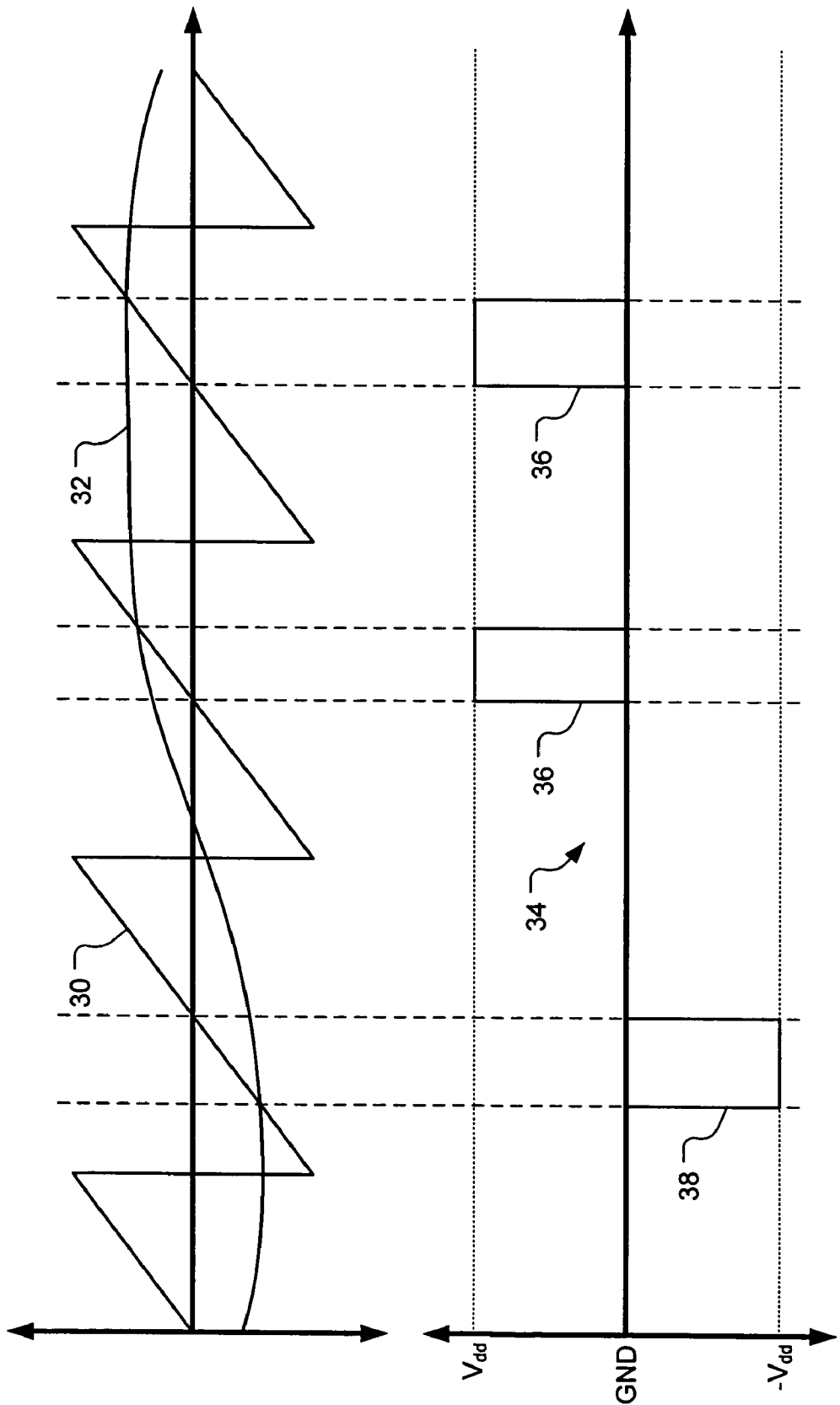
FIG. 2 is a graph illustrating a digital audio input signal that is sampled and converted into a pulse width modulated (PWM) waveform according to the prior art.

The following description of the preferred embodiment(s) is merely exemplary in nature and is in no way intended to limit the invention, its application, or uses. For purposes of clarity, the same reference numbers will be used in the drawings to identify similar elements. As used herein, the term module and/or device refers to an application specific integrated circuit (ASIC), an electronic circuit, a processor (shared, dedicated, or group) and memory that execute one or more software or firmware programs, a combinational logic circuit, and/or other suitable components that provide the described functionality.

Figure 3:
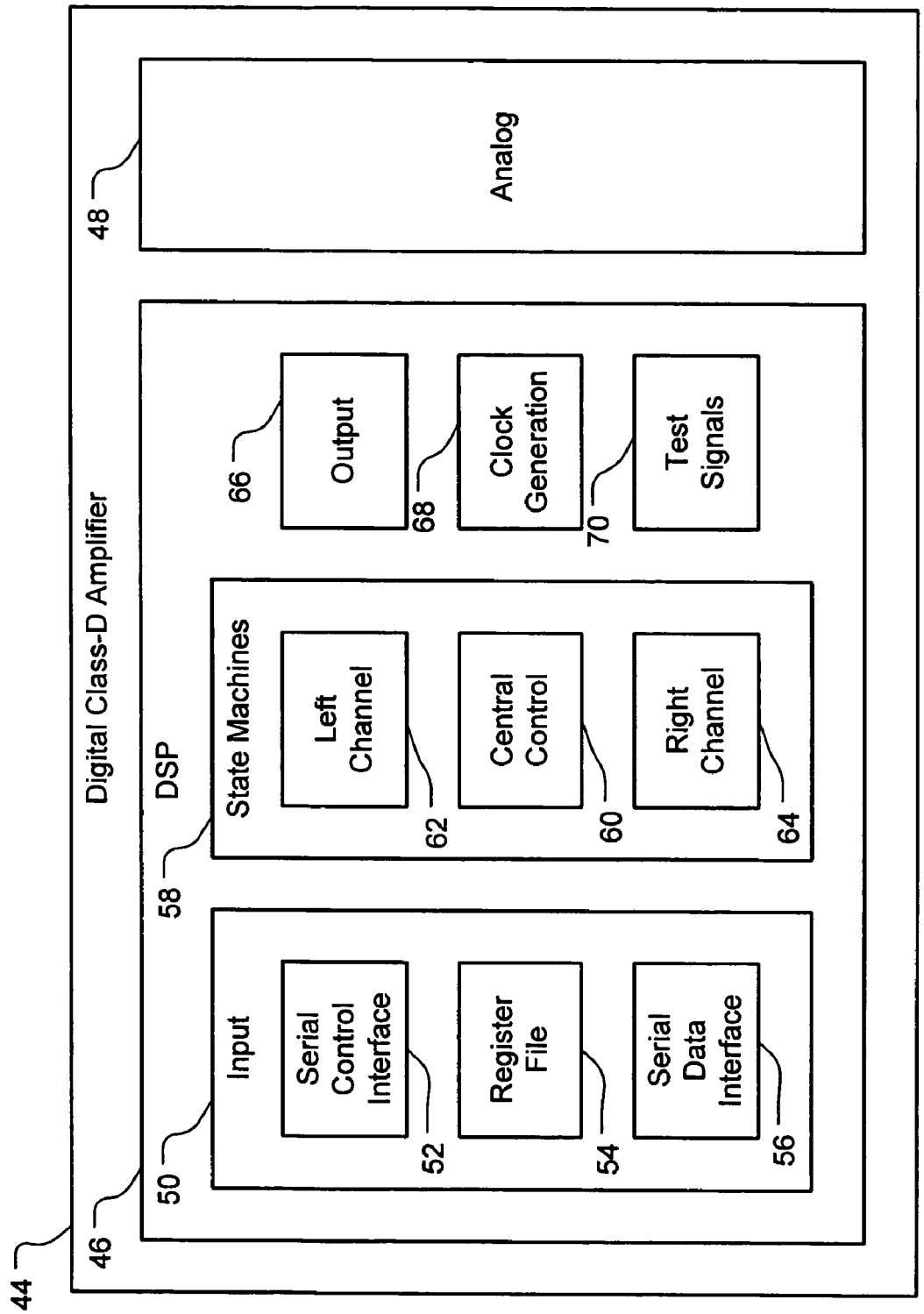
FIG. 3 is a functional block diagram of a system architecture for a digital Class-D power amplifier according to the present invention.

Referring now to FIG. 3, an exemplary digital Class-D power amplifier 44 according to the present invention includes a digital signal processor (DSP) 46 and an analog module 48. The DSP 46 receives a digital audio input signal and converts the input signal into a pulse width modulated (PWM) waveform. The PWM waveform is received by the analog module 48 and acts as a control signal for transistors in the analog module 48. The analog module 48 generates an amplified and filtered waveform based on the PWM waveform. The filtered waveform is received by a load such as an audio speaker to produce an audible signal.

The DSP 46 includes an input module 50 that serves as an interface between external devices and the remaining components of the amplifier 44. The input module 50 includes a serial control interface 52, a register file 54, and a serial data interface 56. For example, the serial control interface 52 may include a 3-wire serial control interface, a 2-wire serial control interface, or another kind of interface 52. The serial control interface 52 programs registers located in the register file 54. The serial control interface 52 also sends/receives control signals throughout the DSP 46. Relevant parameters relating to the amplifier 44 are stored in the register file 54. For example, the register file 54 is programmed in order to play or mute music. This allows other components of the amplifier 44 to detect a play request, mute request, or another request.

The serial data interface 56 loads audio input signals into the amplifier 44. For example, the serial data interface 56 may include a 3-wire serial data interface or another kind of interface 56. A control module 58 includes a central control module 60, a left channel module 62, and a right channel module 64. Signal flow through the DSP 46 is controlled by the central control module 60.

The central control module 60 generates control signals for both the right and left channels. Additionally, the right and left channel modules 64 and 62, respectively, control respective arithmetic logic units (ALUs), read and write to respective memory locations, and perform housekeeping operations. The DSP 46 includes an output module 66 that converts sampled points of the input signal into a PWM waveform. A clock generation module 68 generates system clocks and receives master clock signals from external devices. A test signal module 70 generates test signals that are used to verify proper operation of components in the amplifier 44.

Figure 4:
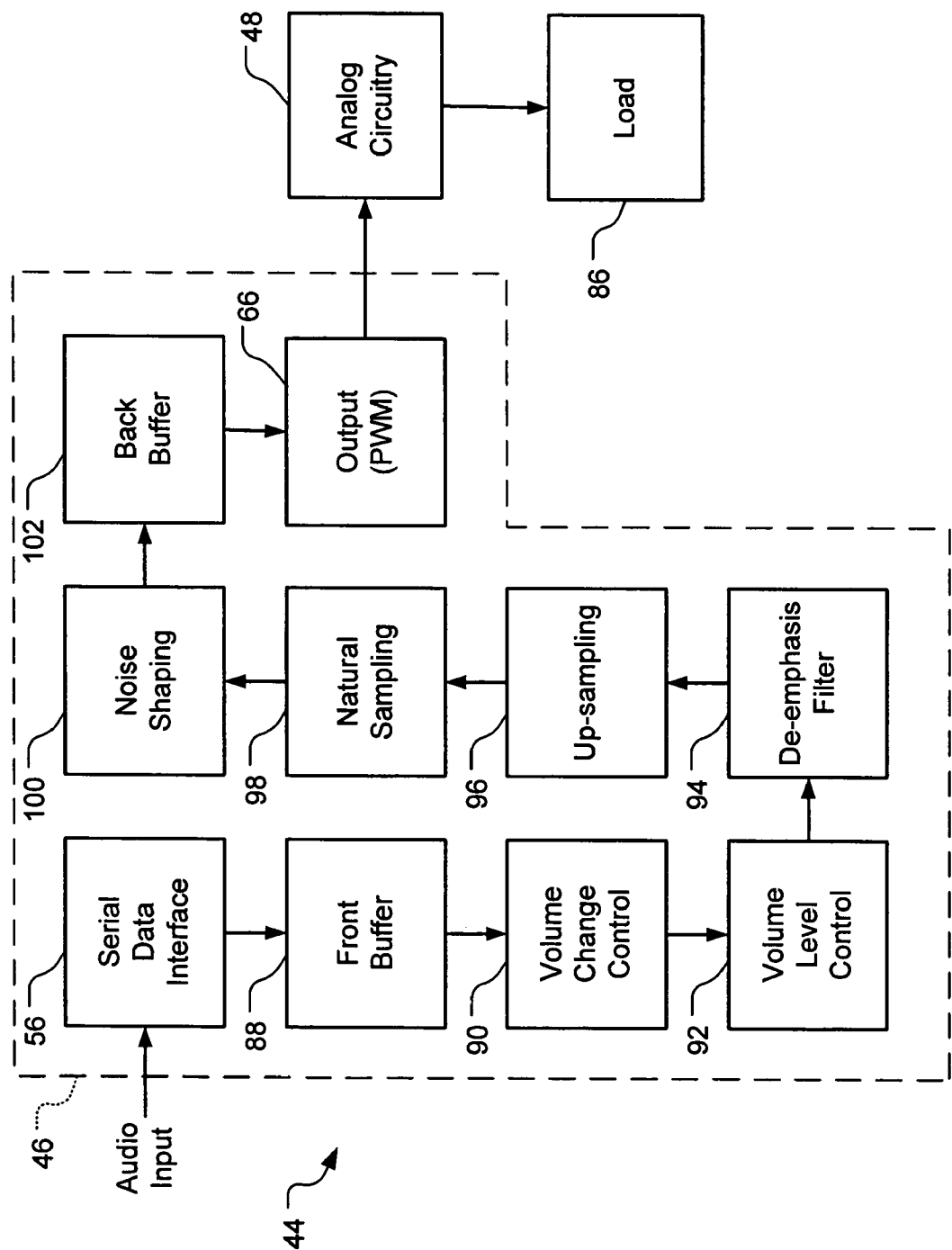
FIG. 4 is a functional block diagram of the DSP illustrated in further detail.

Referring now to FIG. 4, the DSP 46 receives an audio input signal and generates a PWM waveform that duplicates the content of the input signal. The analog module 48 receives the PWM waveform and generates an amplified waveform. A load module 86 includes an audio device such as a speaker and receives the amplified waveform to produce an audible signal. The serial data interface 56 transmits the input signal to a front buffer module 88. For example, the front buffer module 88 may be a first in first out (FIFO) buffer 88. The input signal is temporarily stored in the front buffer module 88 and read out by a volume change control module 90. The volume change control module 90 detects abrupt changes in the volume of the input signal. The volume change control module 90 ensures that the volume of the input signal gradually rolls from an off state to an on state and from an on state to an off state.

A volume level control module 92 receives the input signal from the volume change control module 90. The volume level control module 92 functions like a multiplier to control an overall volume of the input signal. The volume can be both increased and decreased. The input signal is then received by a de-emphasis filter 94. The de-emphasis filter 94 allows the amplifier 44 to be backward compatible with an audio signal that has been pre-emphasized. Therefore, the de-emphasis filter 94 offsets the pre-emphasis effect. An up-sampling module 96 optionally increases a frequency at which the input signal is sampled. For example, if the input signal was sampled at a frequency of 48 kHz, the up-sampling module 96 may up-sample the input signal to 2 times, 4 times, 8 times, or another multiple of the previous frequency.

A natural sampling module 98 samples the input signal in order to generate points that are used by the output module 66 to generate the PWM waveform. Since the analog module 48 does not have a relatively high resolution, a noise shaping module 100 reduces the resolution of the input signal. For example, without the noise shaping module 100, the PWM waveform generated by the output module 66 may have a resolution of 20 bits. Therefore, the noise shaping module 100 reduces the resolution to a level that is more compatible with the analog module 48.

The noise shaping module 100 maintains the resolution of noise in the audio band, and noise that is outside of the audio band is removed. Data from the noise shaping module 100 is temporarily stored in a back buffer 102. For example, the back buffer 102 may be a FIFO buffer. The output module 66 receives data from the back buffer 102 and generates a PWM waveform. The output module 66 transmits the PWM waveform to the analog module 48. Those skilled in the art can appreciate that the DSP 46 may include fewer or additional modules. Additionally, the order in which the modules are illustrated may be altered.

Figure 5:
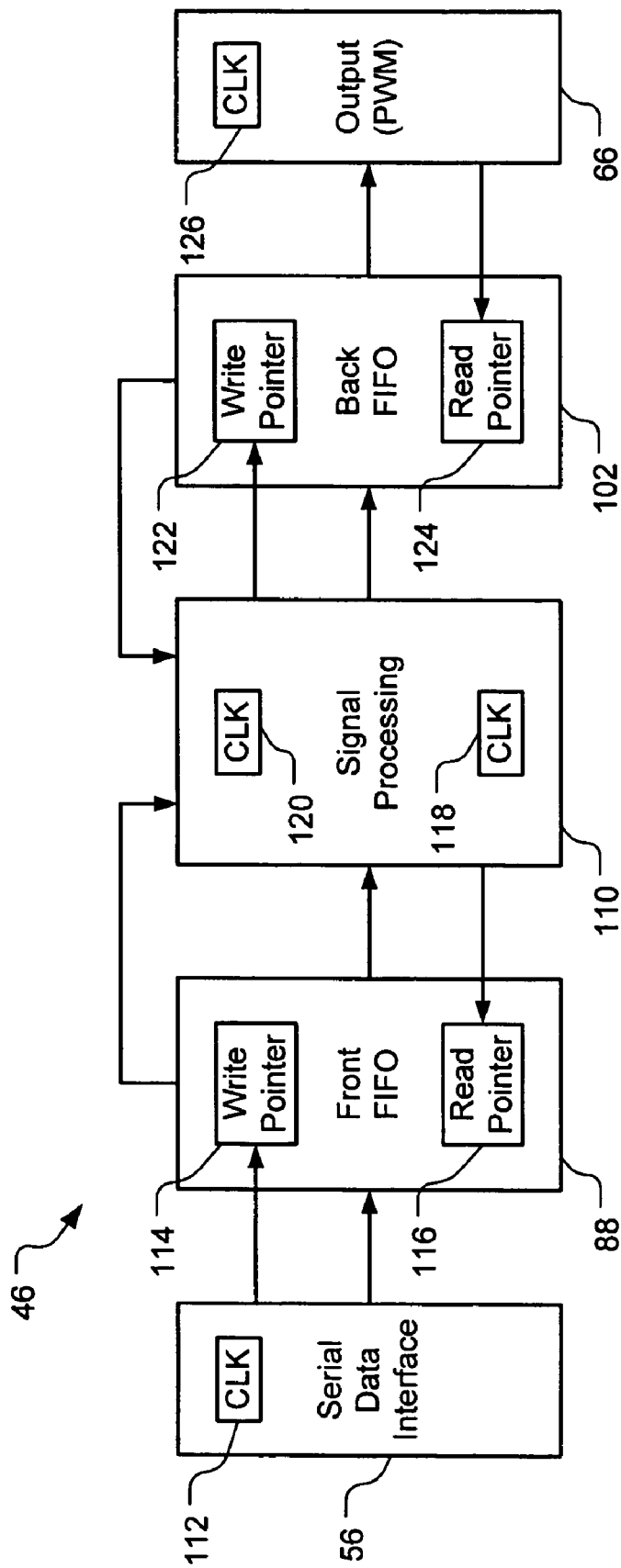
FIG. 5 is a functional block diagram of an input/output data rate synchronization system including a signal processing module and first in first out (FIFO) data buffers according to the present invention.

Referring now to FIG. 5, modules in the DSP 46 that are sequentially located between the front buffer module 88 and the back buffer module 102 are collectively identified as a signal processing module 110. The present invention facilitates input/out data rate synchronization throughout of the DSP 46. The serial data interface 56 includes a first clock 112 and writes data to the front buffer 88 at a frequency of the first clock 112. In an exemplary embodiment, the front and back buffers 88 and 102, respectively, are FIFO buffers. FIFO buffers output data in the same order that the data is stored in the FIFO buffer. Therefore, FIFO buffers prevent data from being unintentionally discarded when data rates into and out of devices vary or are not sufficiently matched.

The front FIFO 88 includes a first write pointer 114 and a first read pointer 116. The first read pointer 116 identifies an address within the front FIFO 88 where a next block of data in sequence is to be read. The first write pointer 114 identifies an address within the front FIFO 88 where a next block of data is to be written. The serial data interface 56 communicates with the first write pointer 114 and increments the first write pointer 114 when a current data address in the front FIFO 88 is full. The front FIFO 88 also transmits a signal to the signal processing module 110 that indicates current positions of the first read and write pointers 116 and 114, respectively.

The signal processing module 110 includes a second clock 118 and reads data from the front FIFO 88 at a frequency of the second clock 118. The signal processing module 110 communicates with the first read pointer 116 and increments the first read pointer 116 when the signal processing module 110 reads all of the data located at a current data address. The signal processing module 110 also includes a third clock 120 and writes data to the back FIFO 102 at a frequency of the third clock 120. The back FIFO 102 includes a second write pointer 122 and a second read pointer 124 that are analogous to the first write and read pointers 114 and 116, respectively, of the front FIFO 88.

The second and third clocks 118 and 120, respectively, may be either uniformly or non-uniformly generated. In an exemplary embodiment, both the second and third clocks 118 and 120, respectively, are non-uniformly generated. In this case, the second and third clocks 118 and 120, respectively, are signal-generated by the signal processing module 110. In another exemplary embodiment, a frequency of the second clock 118 is initially set equal to a frequency of the first clock 112.

The signal processing module 110 communicates with the second write pointer 122 and increments the second write pointer 122 when a current data address is full. Additionally, the back FIFO 102 transmits a signal to the signal processing module 110 that indicates current positions of the second read and write pointers 124 and 122, respectively. The output module 66 includes a fourth clock 126 and reads data from the back FIFO 102 at the frequency of the fourth clock 126.

The output module 66 communicates with the second read pointer 124 and increments the second read pointer 124 when the output module 66 reads all of the data located at a current data address. One or more of the clocks 112, 118, 120, and/or 126 may be generated by a device that is located external to the DSP 46. For example, a phase-locked loop (PLL) or another clock generation circuit may generate one or more of the clocks 112, 118, 120, and/or 126. In an exemplary embodiment, the first and fourth clocks 112 and 126, respectively, are uniformly generated by a PLL and/or another clock generation circuit.

Ideally, the rate that data is transmitted between each of the devices illustrated in FIG. 5 is constant. In this case, data flow through the DSP 46 is consistent and uninterrupted. However, discrepancies often exist between clock signals. For example, the third clock 120 may be programmed to be equal to the fourth clock 126. However, the fourth clock 126 may operate at a frequency that is slightly off from an intended frequency. Unless the discrepancy is corrected, the third clock 120 will continue to operate at the intended frequency. In this case, the second write pointer 122 will increment faster or slower than the second read pointer 124. Eventually, the discrepancy will cause a buffer overflow or buffer underflow condition.

A buffer overflow condition occurs when a write pointer advances faster than a respective read pointer and the FIFO fills with data. Incoming data is potentially discarded when the FIFO becomes full. A buffer underflow condition occurs when a read pointer advances faster than a respective write pointer. In this case, the device reading from the FIFO remains idle and wastes clock cycles checking for data when none exists in the FIFO. In an exemplary embodiment, the first and fourth clocks 112 and 126, respectively, are fixed. Additionally, the second clock 118 is initialized as equal to the first clock 112 and the third clock 120 is initialized as slightly greater than the fourth clock 126. Initializing the third clock 120 as slightly greater than the fourth clock 126 avoids a buffer underflow condition.

The method of the present invention detects data rate discrepancies between data entering and exiting the back FIFO 102. As discrepancies are detected, the signal processing module 110 takes remedial action to synchronize the two data paths. Similarly, the signal processing module 110 detects data rate discrepancies between data entering and exiting the front FIFO 88 and acts to correct the discrepancies. While the read and write frequencies for the FIFOs 88 and 102 are not required to be equal at every clock cycle, it is desirable for the frequencies to be equal on average during any extended period.

If the read and write frequencies at each of the FIFOs 88 and 102 are equal an average amount of time, little discrepancy likely exists between the front and back ends of the system. However, adjusting data rates at the back end inherently affects data rates at the front end. Therefore, the method of the present invention allows the read and write frequency combinations for the front and back FIFOs 88 and 102, respectively, to be integrally synchronized.

The signal processing module 110 begins by synchronizing the read and write frequencies of the back FIFO 102. The frequency of the fourth clock 126 is initialized to a fixed switching frequency. For example, the frequency of the fourth clock 126 may be set to 400 kHz. However, due to imperfections in clock signal generation, the actual frequency of the fourth clock 126 may be 400.001 kHz. Therefore, the frequency of the third clock 120 is set slightly greater than 400 kHz in order to avoid a buffer underflow condition.

Since the third clock 120 is set greater than the fourth clock 126, the second write pointer 122 increments faster than the second read pointer 124. If allowed to continue, this eventually leads to a buffer overflow condition. The signal processing module 110 monitors the current positions of the second read and write pointers 124 and 122, respectively. If the distance between the second read and write pointers 124 and 122, respectively, with respect to the size of the back FIFO 102 is greater than a predetermined value, the signal processing module 110 enters a break state. During the break state, the signal processing module 110 temporarily stops reading data from the front FIFO 88 and storing data in the back FIFO 102.

In an exemplary embodiment, the frequency of the fourth clock 126 is set equal to the frequency of a sawtooth waveform in the natural sampling module 98. Therefore, the frequency of the third clock 120 is also slightly higher than the frequency of the sawtooth waveform. The signal processing module 110 remains in the break state until the relative distance between the second read and write pointers 124 and 122, respectively, returns to a value that is less than or equal to the predetermined value. Entering and exiting the break state affects the synchronization between the third and fourth clocks 120 and 126, respectively. However, as long as the read and write frequencies for the back FIFO 102 are equal on average, the circuit functions desirably.

Figure 6:
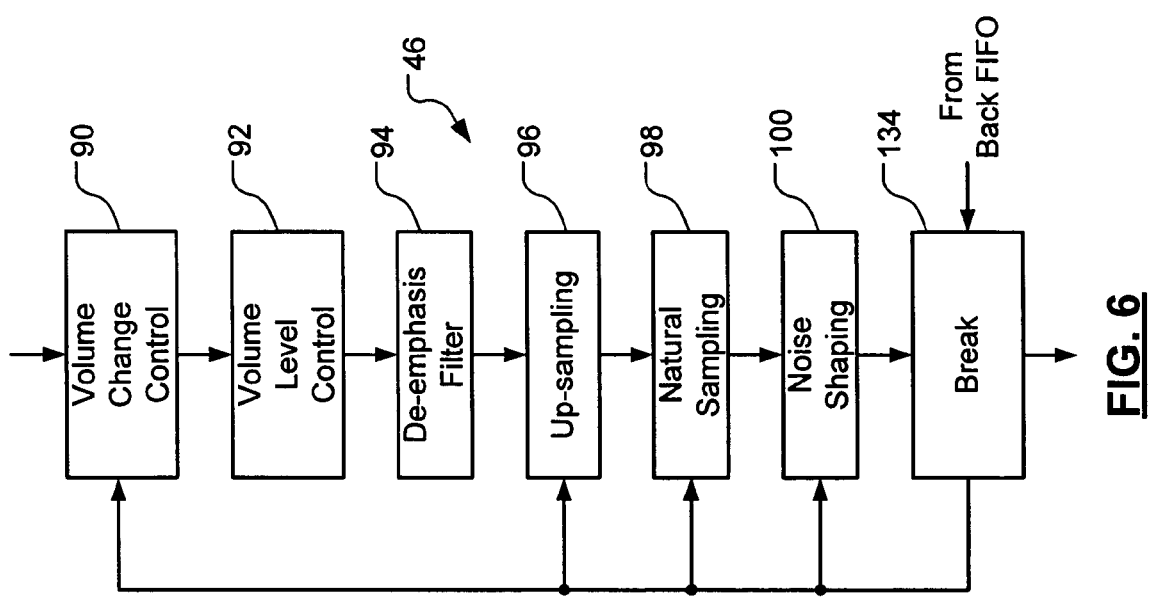
FIG. 6 is a functional block diagram of the DSP including a break module that temporarily stops operation of the modules included in the DSP.

Referring now to FIG. 6, the DSP 46 includes a break module 134. The break module 134 receives the signal from the back FIFO 102 indicating the positions of the second read and write pointers 124 and 122, respectively. Based on the relative distance between the second read and write pointers 124 and 122, respectively, the break module 134 initiates the break state when necessary. The break module 134 communicates with relevant modules in the DSP 46 in order to temporarily stop the signal processing module 110 from reading data from the front FIFO 88 and writing data to the back FIFO 102.

Figure 7:
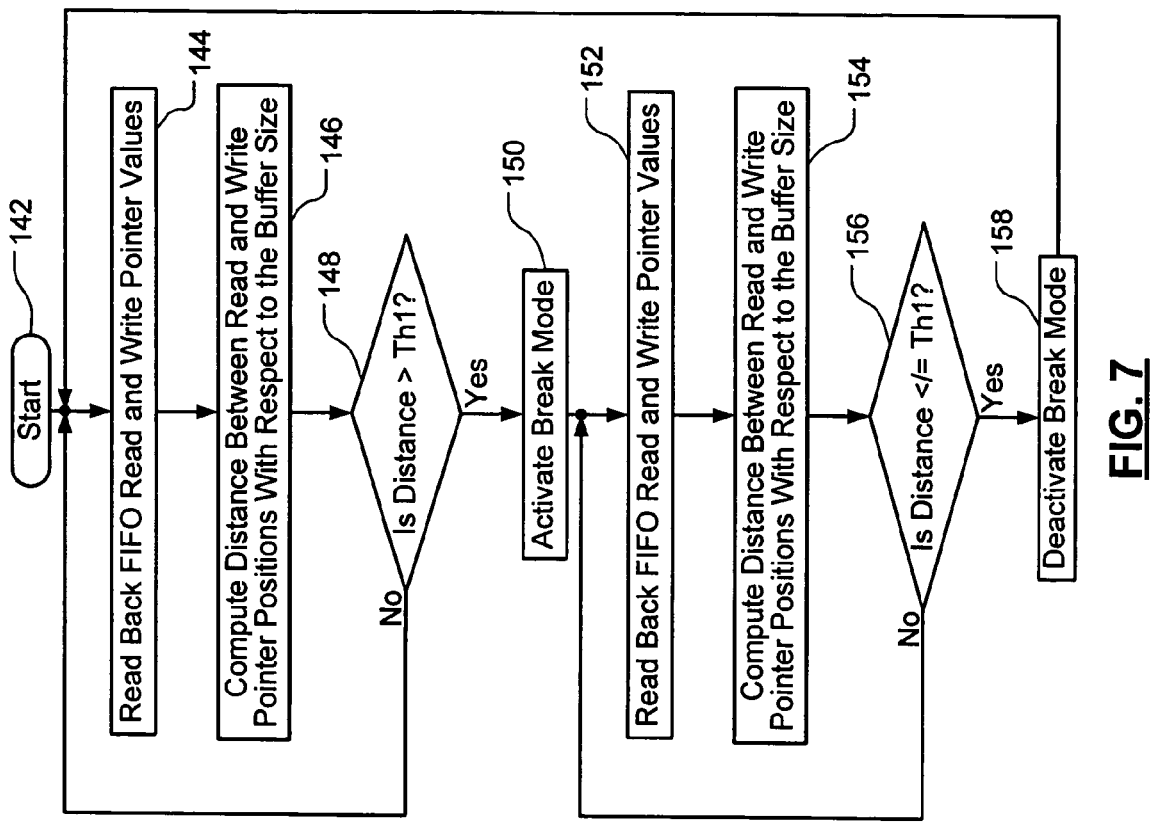
FIG. 7 is a flowchart illustrating steps performed by the break module in FIG. 6 to synchronize data rates before and after the back buffer module.

Referring now to FIG. 7, a back FIFO 102 synchronization algorithm begins in step 142. In step 144, the break module 134 reads the values of the second read and write pointers 124 and 122, respectively. In step 146, the break module 134 computes the relative distance between the positions of the second read and write pointers 124 and 122, respectively. In step 148, control determines whether the relative distance between the second read and write pointers 124 and 122, respectively, is greater than a first predetermined value. If false, control returns to step 144. If true, control proceeds to step 150.

In step 150, the break module 134 activates the break state. In step 152, the break module 134 reads the values of the second read and write pointers 124 and 122, respectively. In step 154, the break module 134 computes the relative distance between the second read and write pointers 124 and 122, respectively. In step 156, control determines whether the distance is less than or equal to the first predetermined value. If false, control returns to step 152. If true, control proceeds to step 158. In step 158, the break module 134 deactivates the break state and control returns to step 144.

After synchronizing the read and write frequencies of the back FIFO 102, the signal processing module 110 synchronizes the read and write frequencies of the front FIFO 88. Similarly to the third and fourth clocks 120 and 126, respectively, clock generation imperfections may cause a slight discrepancy between the frequencies of the first and second clocks 112 and 118, respectively. Additionally, when the break module 134 initiates the break state, the signal processing module 110 temporarily stops reading data from the front FIFO 88. During this time, the relative distance between the first read and write pointers 116 and 114, respectively, increases. Therefore, the signal processing module 110 adjusts the frequency of the second clock 118 so that the read and write frequencies of the front FIFO 88 are approximately equal.

The frequency of the second clock 118 is defined as $f_{rd}$ and is set equal to $$\frac{Q[\text{t\_ratio}]f_{sw} + v}{\alpha}.$$

In this formula, the $Q[\ldots]$ function is a quantization operator, $v$ is a random variable with a zero mean, and $f_{sw}$ is equal to the frequency of the sawtooth waveform in the natural sampling module 98 as well as the fourth clock 126. The term t_ratio is set equal to $$\frac{\alpha f_{up}}{f_{sw}},$$

where $f_{up}$ is the target sampling frequency of the input audio signal. Therefore, $f_{rd}$ differs from $f_{up}$ by the Q[t_ratio] term as well as possible noise. In an exemplary embodiment, $f_{up}$ is initially set as the frequency of the first clock 112, which is approximately equal to the sampling frequency of the input audio signal.

The term ($\alpha f_{up}$) is used as the frequency of the up-sampling module 96, where $\alpha$ is set equal to a scaling factor such as 2, 4, 8, or another number. For example, if the sampling frequency of the audio input signal is 48 kHz, the up-sampling frequency of the up-sampling module 96 may be 8×48 kHz=384 kHz. Therefore, adjusting the value of t_ratio adjusts the value of the up-sampling frequency in the up-sampling module 96 as well as the frequency of the second clock 118.

Figure 8:
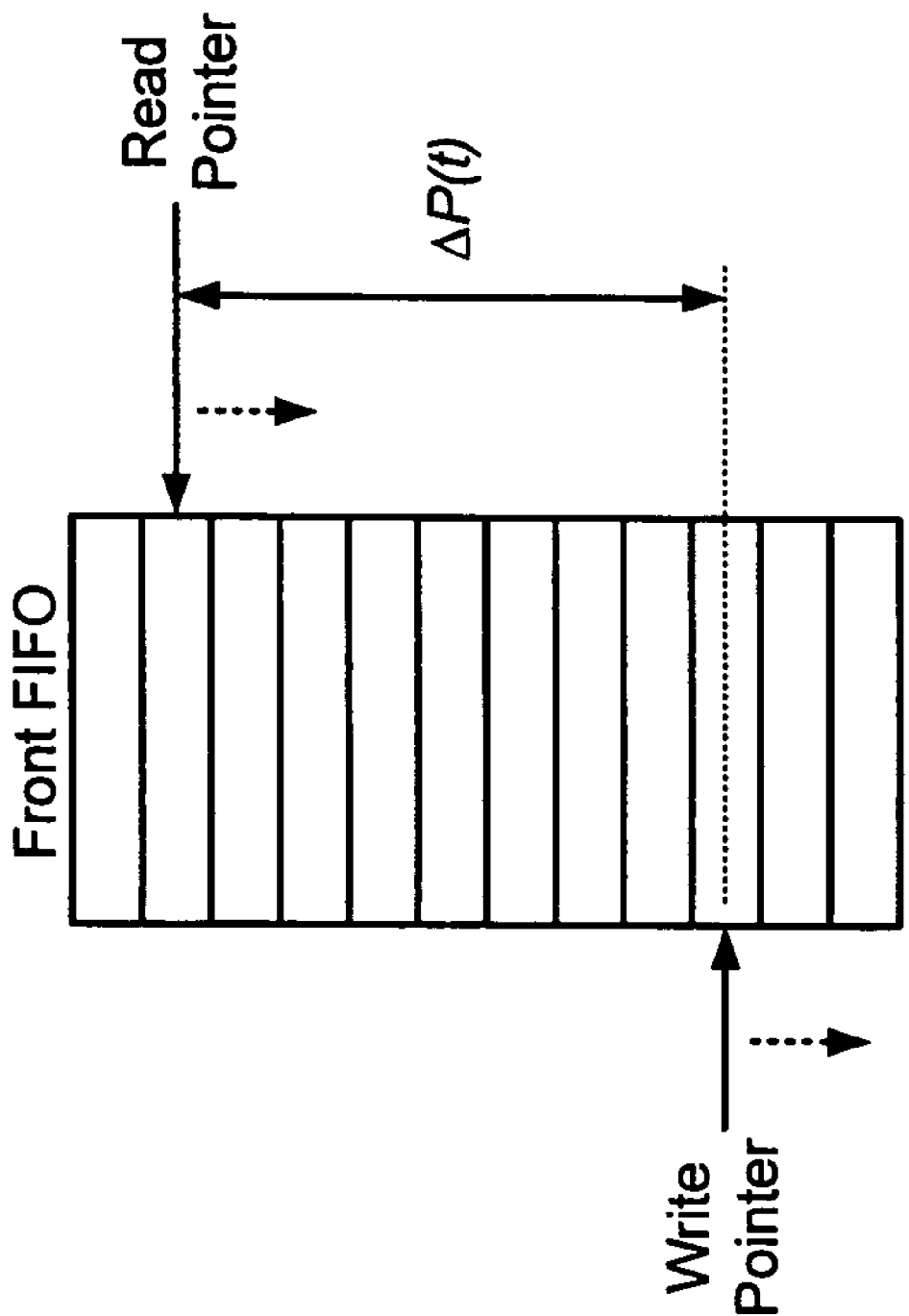
FIG. 8 illustrates an exemplary FIFO data buffer.

Referring now to FIG. 8, the term $\Delta P(t)$ is set equal to the relative difference between the values of the first read and write pointers 116 and 114, respectively, in the front FIFO 88 at a time t. The signal processing module 110 constantly monitors the value of t_ratio and updates the value when necessary to ensure that $\Delta P(t)$ remains within a range defined as $[-P_{limit}, +P_{limit}]$. The term $P_{limit}$ identifies the maximum allowable separation between the values of the first read and write pointers 116 and 114, respectively.

Figure 9:
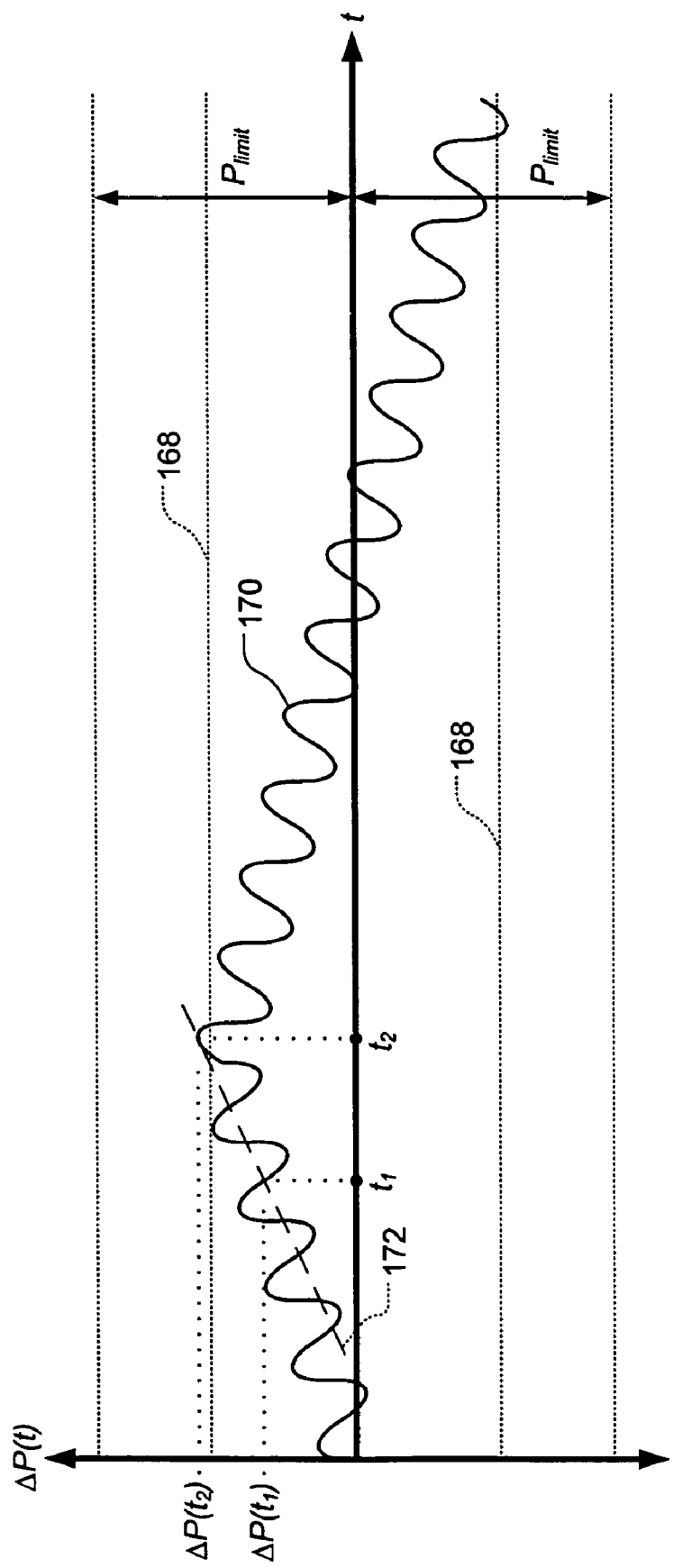
FIG. 9 is a graph illustrating the distance between the read and write pointers of the front buffer module as a function of time.

Referring now to FIG. 9, the signal processing module 110 updates the current value for t_ratio based on a previously stored value for t_ratio and at specified times. The signal processing module 110 updates t_ratio when the magnitude of the difference between a current value for $\Delta P(t)$ and a previous value of $\Delta P(t)$ is greater than a predetermined value, or according to $|\Delta P(t_n) - \Delta P(t_{n-1})| > \text{Th2}$, where Th2 is a predetermined threshold. Additionally, the signal processing module 110 updates t_ratio when the magnitude of the current value of ΔP(t) is greater than a threshold (identified by 168 in FIG. 9), or according to |ΔP(t$_n$)|>Th3, where Th3 is a predetermined threshold that is different from Th2.

The previous value of t_ratio at clock cycle t$_1$ is updated with the value of t_ratio at clock cycle t$_2$. An updated value for t_ratio, is defined as t_ratio(t$_2$)=t_ratio(t$_1$)*(1+k+oc(t$_2$)), where k is the rate of change of ΔP(t) between times t$_1$ and t$_2$. The term oc(t$_2$) is an overcorrection factor that is determined at time t$_2$. If t_ratio was only adjusted based on the slope factor (1+k), the plot 170 of ΔP(t) would continue increasing or decreasing due to noise. Utilizing the overcorrection factor makes it possible to change the direction of ΔP(t). If ΔP(t) continues to increase as well as decrease, the read and write frequencies of the front FIFO 88 will be equal on average.

As shown in FIG. 9, k may be computed as a linear approximation of the rate of change of ΔP(t) between t$_1$ and t$_2$. In this case, k is the slope of a line 172 between the points on ΔP(t) identified by t$_1$ and t$_2$, or k=(ΔP(t$_2$)−ΔP(t$_1$))/(t$_2$−t$_1$). The overcorrecting term oc(t$_2$) may be implemented in a number of ways. In an exemplary embodiment, the overcorrecting factor is integrated into the formula for k. For example, k may be defined as $$\frac{\Delta P(t_2) - \Delta P(t1) \pm 1}{t_2 - t_1},$$

wherein +/−1 is the overcorrecting factor. For example, if ΔP(t$_2$)−ΔP(t$_1$) is a positive number, then +1 is added to the difference. If ΔP(t$_2$)−ΔP(t$_1$) is a negative number, then −1 is added to the difference. Alternatively, the correction factor may be computed based on a percentage of ΔP(t) in a given time period.

Instead of computing ΔP(t) at discrete times, averages of ΔP(t) over two time periods may be compared. In this case, the accuracy of the t_ratio updates may be improved. While a single ΔP(t) threshold 168 is shown in FIG. 9, several intermediate thresholds may be utilized between the x-axis and +/−P$_{limit}$. Additionally, the method of the present invention can be utilized with DSPs 46 having natural sampling modules 98 that utilize spread spectrum natural sampling.

Figure 10:
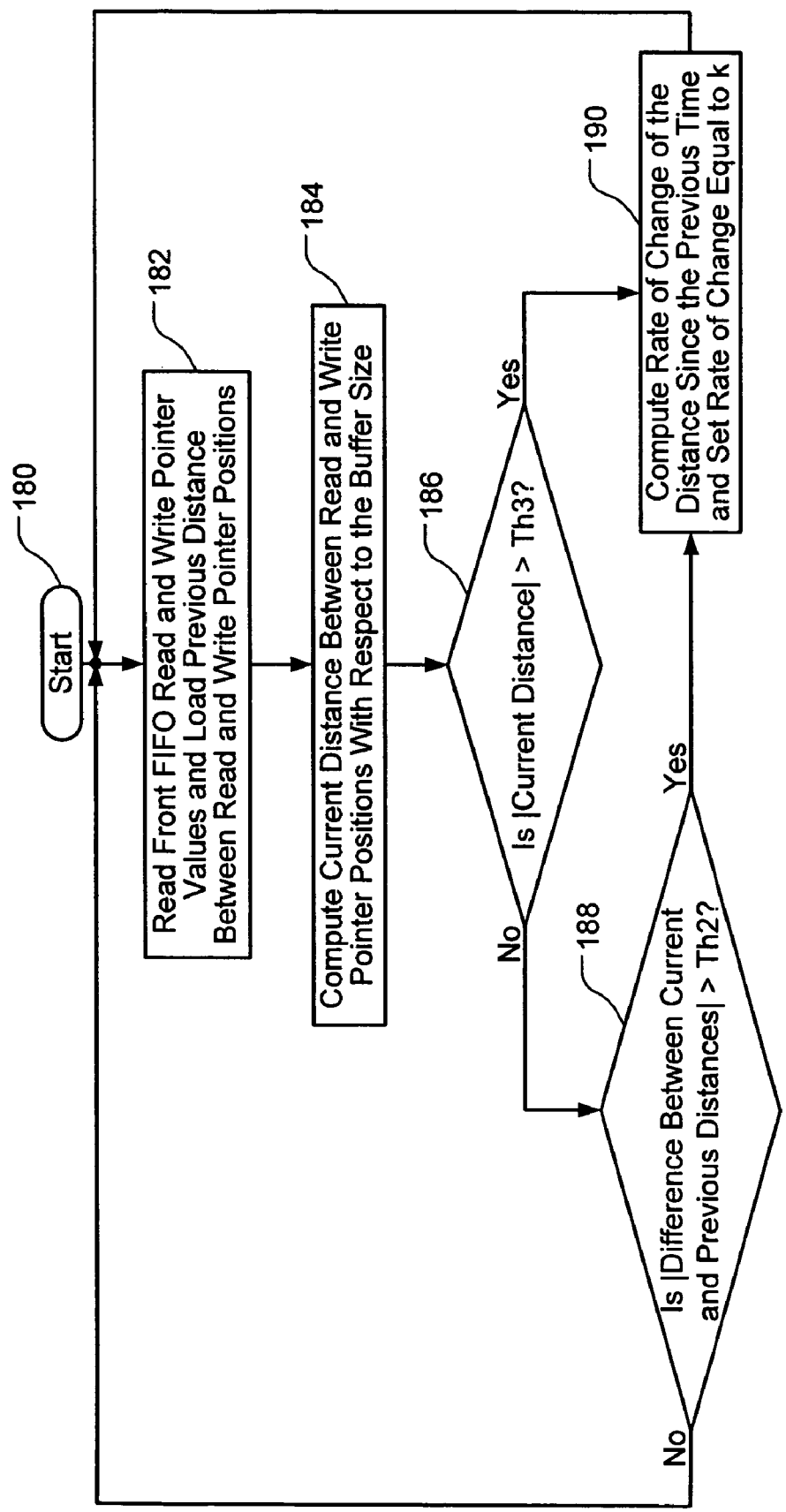
FIG. 10 is a flowchart illustrating steps performed by the signal processing module in FIG. 5 in order to synchronize the data rates before and after the front buffer module.

Referring now to FIG. 10, a front FIFO 88 synchronization algorithm begins in step 180. In step 182, the signal processing module 110 reads the current values of the first read and write pointers 116 and 114, respectively, and loads the value of the previous distance between the first read and write pointers 116 and 114. In step 184, the signal processing module 110 computes the current relative distance between the first read and write pointers 116 and 114, respectively, in the front FIFO 88. In step 186, control determines whether the absolute value of the current distance is greater than the predetermined value Th3. If false, control proceeds to step 188. If true, control proceeds to step 190.

In step 190, the signal processing module 110 computes the rate of change of the distance since the previous time and sets the result equal to k in order to adjust the value of t_ratio and control returns to step 182. In step 188, control determines whether the absolute value of the difference between the current and previous distances is greater than the predetermined value Th2. If true, control proceeds to step 190. If false, control returns to step 182.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, specification, and the following claims.

What is claimed is:

1. An input/output data rate synchronization system comprising:
   a first data buffer that receives input data at a first rate, that temporarily stores said input data, and that outputs said input data at a second rate;
   a data processing module that receives said input data from said first data buffer at said second rate and that outputs processed data at a third rate that is different than said second data rate; and
   a second data buffer that receives said processed data from said data processing module at said third rate, that temporarily stores said processed data, and that outputs said processed data at a fourth rate that is different than said third data rate,
   wherein said data processing module temporarily stops receiving said input data and generating said processed data when said second data buffer exceeds a first predetermined capacity,
   wherein said data processing module increases said second rate when said first data buffer exceeds a second predetermined capacity,
   wherein said first data buffer includes a read pointer and a write pointer and wherein said data processing module determines an amount of said input data in said first data buffer with respect to said second predetermined capacity by computing a difference between positions of said read and write pointers, and
   wherein said second rate is based on a rate of change of said difference between positions of said read and write pointers.

2. The input/output data rate synchronization system of claim 1, wherein while said data processing module stops receiving said input data and generating said processed data, said data processing module resumes receiving said input data and generating said processed data when said second data buffer no longer exceeds said first predetermined capacity.

3. The input/output data rate synchronization system of claim 1, wherein said second data buffer includes a read pointer and a write pointer and wherein said data processing module determines an amount of said processed data in said second data buffer with respect to said first predetermined capacity by computing a difference between positions of said read and write pointers.

4. The input/output data rate synchronization system of claim 1, wherein said input data is a digital audio signal and wherein said first rate is equal to a first sampling frequency of said digital audio signal.

5. The input/output data rate synchronization system of claim 4, wherein said data processing module includes:
   an up-sampling module that increases said first sampling frequency to a second sampling frequency; and
   a natural sampling module that samples said digital audio signal based on a reference signal,
   wherein said data processing module adjusts a ratio of said second sampling frequency to a frequency of said reference signal in order to adjust said second rate.

6. The input/output data rate synchronization system of claim 1, wherein at least one of said first rate and/or said fourth rate is fixed.

7. The input/output data rate synchronization system of claim 1, wherein said data processing module updates a value of said rate of change when a difference between a first difference between positions of said read and write pointers at a first time and a second difference between positions of said read and write pointers at a second time is greater than a predetermined value.

8. The input/output data rate synchronization system of claim 1, wherein said data processing module updates a value of said rate of change when a current difference between positions of said read and write pointers is greater than a predetermined value.

9. The input/output data rate synchronization system of claim 1, wherein said data processing module updates a value of said rate of change when a difference between a first average of differences between positions of said read and write pointers over a first time period and a second average of differences between positions of said read and write pointers over a second time period is greater than a predetermined value.

10. The input/output data rate synchronization system of claim 1, wherein said data processing module updates a value of said rate of change when an average of differences between positions of said read and write pointers over a time period is greater than a predetermined value.

11. The input/output data rate synchronization system of claim 1, wherein said data processing module includes a natural sampling module that samples said input data based on a reference signal.

12. The input/output data rate synchronization system of claim 11, wherein said reference signal is a sawtooth waveform.

13. The input/output data rate synchronization system of claim 11, wherein said natural sampling module varies a frequency of said reference signal in order to perform spread spectrum natural sampling.

14. The input/output data rate synchronization system of claim 11, wherein said fourth rate is initially set equal to a frequency of said reference signal.

15. The input/output data rate synchronization system of claim 1, wherein said data processing module decreases said second rate when a difference between said second and first rates is greater than a predetermined rate.

16. The input/output data rate synchronization system of claim 1, wherein said third rate is initially set greater than said fourth rate.

17. The input/output data rate synchronization system of claim 1, wherein said second rate is initially set equal to said first rate.

18. The input/output data rate synchronization system of claim 1, wherein said input data is a digital audio signal.

19. The input/output data rate synchronization system of claim 1, wherein said first and second data buffers are first in first out (FIFO) data buffers.

20. A digital signal processor (DSP) comprising the input/output data rate synchronization system of claim 1.

21. A digital Class-D amplifier comprising the DSP of claim 20.

22. A method for operating an input/output data rate synchronization system, the method comprising:
providing a first data buffer that receives input data at a first rate, that temporarily stores said input data, and that outputs said input data at a second rate;
receiving said input data from said first data buffer at said second rate;
outputting processed data at a third rate that is different than said second data rate;
providing a second data buffer that receives said processed data at said third rate, that temporarily stores said processed data, and that outputs said processed data at a fourth rate that is different than said third data rate;
temporarily stopping receiving said input data and generating said processed data when said second data buffer exceeds a first predetermined capacity;
increasing said second rate when said first data buffer exceeds a second predetermined capacity, and
determining an amount of said input data in said first data buffer with respect to said second predetermined capacity by computing a difference between positions of read and write pointers in said first data buffer,
wherein said second rate is based on a rate of change of said difference between positions of said read and write pointers.

23. The method of claim 22, further comprising, after temporarily stopping receiving said input data and generating said processed data, resuming receiving said input data and generating said processed data when said second data buffer no longer exceeds said first predetermined capacity.

24. The method of claim 22, further comprising determining an amount of said processed data in said second data buffer with respect to said first predetermined capacity by computing a difference between positions of read and write pointers in said second data buffer.

25. The method of claim 22, wherein said input data is a digital audio signal, and wherein said first rate is equal to a first sampling frequency of said digital audio signal.

26. The method of claim 25, further comprising:
increasing said first sampling frequency to a second sampling frequency;
sampling said digital audio signal based on a reference signal; and
adjusting a ratio of said second sampling frequency to a frequency of said reference signal in order to adjust said second rate.

27. The method of claim 22, wherein at least one of said first rate and/or said fourth rate is fixed.

28. The method of claim 22, further comprising updating a value of said rate of change when a difference between a first difference between positions of said read and write pointers at a first time and a second difference between positions of said read and write pointers at a second time is greater than a predetermined value.

29. The method of claim 22, further comprising updating a value of said rate of change when a current difference between positions of said read and write pointers is greater than a predetermined value.

30. The method of claim 22, further comprising updating a value of said rate of change when a difference between a first average of differences between positions of said read and write pointers over a first time period and a second average of differences between positions of said read and write pointers over a second time period is greater than a predetermined value.

31. The method of claim 22, further comprising updating a value of said rate of change when an average of differences between positions of said read and write pointers over a time period is greater than a predetermined value.

32. The method of claim 22, further comprising sampling said input data based on a reference signal.

33. The method of claim 32, wherein said reference signal is a sawtooth waveform.

34. The method of claim 32, further comprising varying a frequency of said reference signal in order to perform spread spectrum natural sampling.

35. The method of claim 32, wherein said fourth rate is initially set equal to a frequency of said reference signal.

36. The method of claim 22, further comprising decreasing said second rate when a difference between said second and first rates is greater than a predetermined rate.

37. The method of claim 22, wherein said third rate is initially set greater than said fourth rate.

38. The method of claim 22, wherein said second rate is initially set equal to said first rate.

39. The method of claim 22, wherein said input data is a digital audio signal.

40. The method of claim 22, wherein said first and second data buffers are first in first out (FIFO) data buffers.

41. The method of claim 22, further comprising integrating said input/output data rate synchronization system in a digital signal processor (DSP).

42. The method of claim 41, further comprising integrating said DSP in a digital Class-D amplifier.

* * * * *